United States Patent
Cao et al.

(10) Patent No.: US 12,011,792 B2
(45) Date of Patent: Jun. 18, 2024

(54) LOADING WORKSTATION

(71) Applicants: Tyco Electronics (Shanghai) Co., Ltd., Shanghai (CN); TE Connectivity Services GmbH, Schaffhausen (CH)

(72) Inventors: Jian Cao, Shanghai (CN); An (Joshua) Yang, Shanghai (CN); Lvhai (Samuel) Hu, Shanghai (CN); Dandan (Emily) Zhang, Shanghai (CN); Fengchun (Fred) Xie, Shanghai (CN); Yun (Shanghai) Liu, Shanghai (CN); Roberto Francisco-Yi Lu, Bellevue, WA (US); Xianghao (Jorge) Bao, Shanghai (CN)

(73) Assignees: Tyco Electronics (Shanghai) Co., Ltd., Shanghai (CN); TE Connectivity Solutions GmbH, Schaffhausen (CH)

( * ) Notice: Subject to any disclaimer, the term of this patent is extended or adjusted under 35 U.S.C. 154(b) by 0 days.

(21) Appl. No.: 18/165,492

(22) Filed: Feb. 7, 2023

(65) Prior Publication Data
US 2023/0249295 A1  Aug. 10, 2023

(30) Foreign Application Priority Data
Feb. 7, 2022 (CN) .......................... 202210116628.2

(51) Int. Cl.
| | |
|---|---|
| *B23P 19/00* | (2006.01) |
| *B25J 5/00* | (2006.01) |
| *B65G 47/14* | (2006.01) |

(52) U.S. Cl.
CPC ........... *B23P 19/007* (2013.01); *B23P 19/002* (2013.01); *B25J 5/007* (2013.01); *B65G 47/1421* (2013.01)

(58) Field of Classification Search
CPC .................. B23P 19/001; B23P 19/002; B23P 19/004–005; B23P 19/007; B25J 5/007; B25J 9/0093; G05D 2201/0216
See application file for complete search history.

(56) References Cited

U.S. PATENT DOCUMENTS

| | | | | |
|---|---|---|---|---|
| 2017/0341221 | A1* | 11/2017 | Hashimoto | ................ B25J 5/02 |
| 2020/0080944 | A1* | 3/2020 | Liu | .................... G01N 21/8851 |
| 2021/0094184 | A1* | 4/2021 | Gilchrist | ................ B25J 19/027 |
| 2021/0116928 | A1* | 4/2021 | Deng | ................... G05D 1/0225 |
| 2022/0019214 | A1* | 1/2022 | Solanki | .................. B65G 43/08 |

FOREIGN PATENT DOCUMENTS

| | | | |
|---|---|---|---|
| CN | 107344285 A | * | 11/2017 |
| DE | 202019102226 U1 | * | 7/2019 |
| DE | 102019134973 A1 | * | 6/2021 |
| GB | 2476793 A | * | 7/2011 |

\* cited by examiner

*Primary Examiner* — Matthew P Travers
(74) *Attorney, Agent, or Firm* — Barley Snyder

(57) ABSTRACT

A loading workstation comprises a docking station including a first transmission device adapted to transmit a carrier for loading components, and a mobile vehicle. The mobile vehicle includes a second transmission device, a feeding device and a loading device. The second transmission device is adapted to dock with the first transmission device to allow the carrier to be continuously transmitted on the first transmission device and the second transmission device. The feeding device is adapted to supply components to be loaded. The loading device is adapted to load the supplied components onto the carrier that has been transferred to the second transmission device.

19 Claims, 10 Drawing Sheets

LOADING WORKSTATION

CROSS-REFERENCE TO RELATED APPLICATIONS

This application claims the benefit of Chinese Patent Application No. CN202210116628.2 filed on Feb. 7, 2022 in the State Intellectual Property Office of China, the whole disclosure of which is incorporated herein by reference.

FIELD OF THE INVENTION

The present invention relates to a loading workstation, in particular to a loading workstation suitable for continuously supplying product components.

BACKGROUND

In the prior art, a product component loading system usually includes a feeding device, a transmission device and a loading device. The feeding device is used to supply the product components, the transmission device is used to transport a carrier used to load the product components, and the loading device is used to load the supplied product components onto the carrier. In prior art systems, however, the feeding device, the transmission device and the loading device are independent subsystems located in respective remote, fixed installation positions. This leads to unnecessary complexity and inefficiency of the entire product component loading system.

SUMMARY

According to an embodiment of the present disclosure, a loading workstation comprises a docking station including a first transmission device adapted to transmit a carrier for loading components, and a mobile vehicle. The mobile vehicle includes a second transmission device, a feeding device and a loading device. The second transmission device is adapted to dock with the first transmission device to allow the carrier to be continuously transmitted on the first transmission device and the second transmission device. The feeding device is adapted to supply components to be loaded. The loading device is adapted to load the supplied components onto the carrier that has been transferred to the second transmission device.

BRIEF DESCRIPTION OF THE DRAWINGS

The invention will now be described by way of example with reference to the accompanying Figures, of which.

DETAILED DESCRIPTION OF THE EMBODIMENTS

Figure 1:
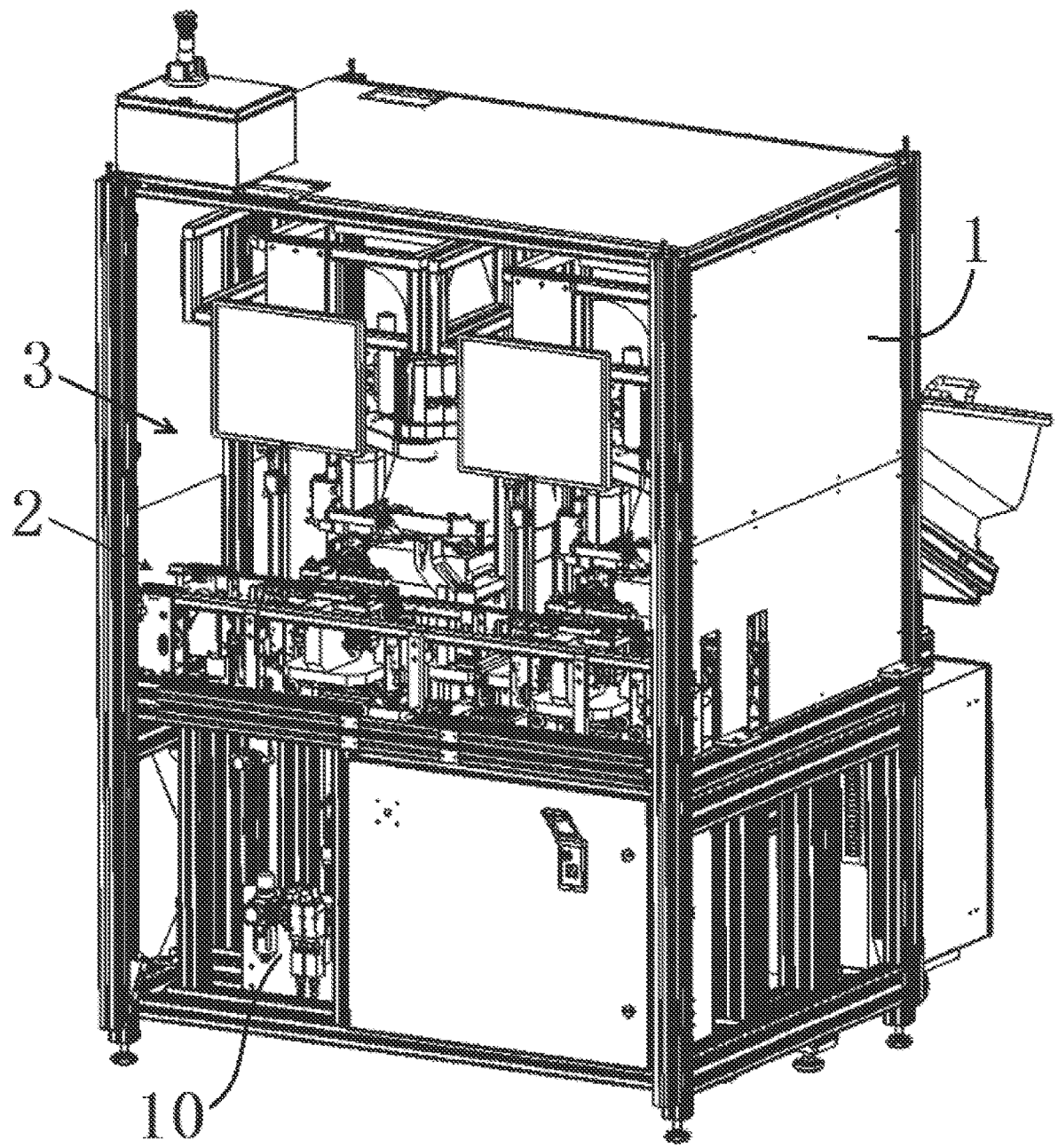
FIG. 1 shows an illustrative perspective view of a loading workstation according to an exemplary embodiment of the present invention when viewed from the rear side.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to one embodiment of the present disclosure, a loading workstation includes a docking station and a mobile vehicle. The docking station comprises a first transmission device used to transmit a carrier for loading components. The mobile vehicle comprises a second transmission device adapted to dock with the first transmission device to allow the carrier to be continuously transmitted on the first transmission device and the second transmission device. The mobile vehicle further comprises a feeding device for supplying components to be loaded, and a loading device for loading the supplied components onto the carrier that has been transferred to the second transmission device.

Figure 2:
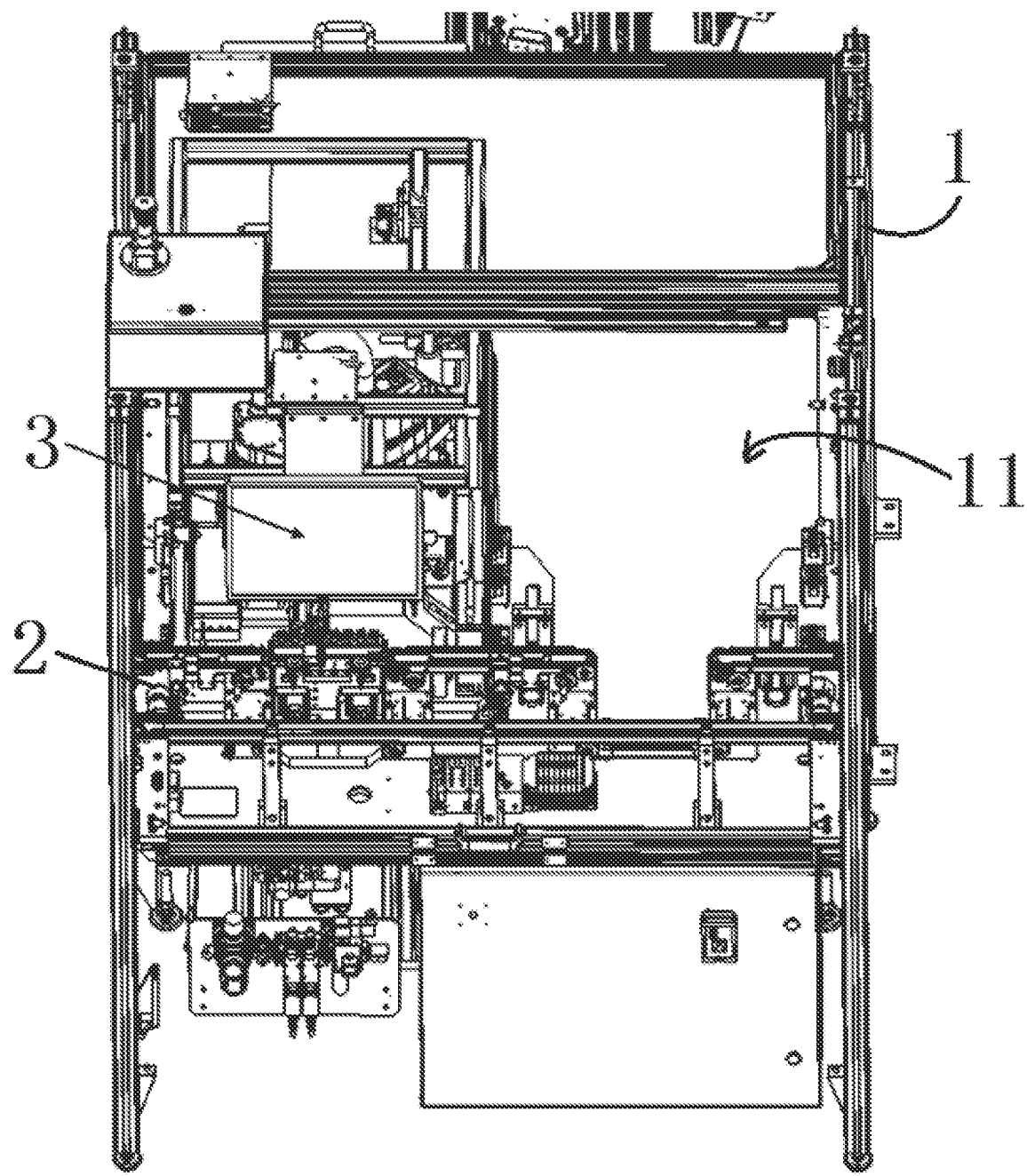
FIG. 2 shows a plan view of a loading workstation according to an exemplary embodiment of the present invention when viewed from the rear side.
Figure 3:
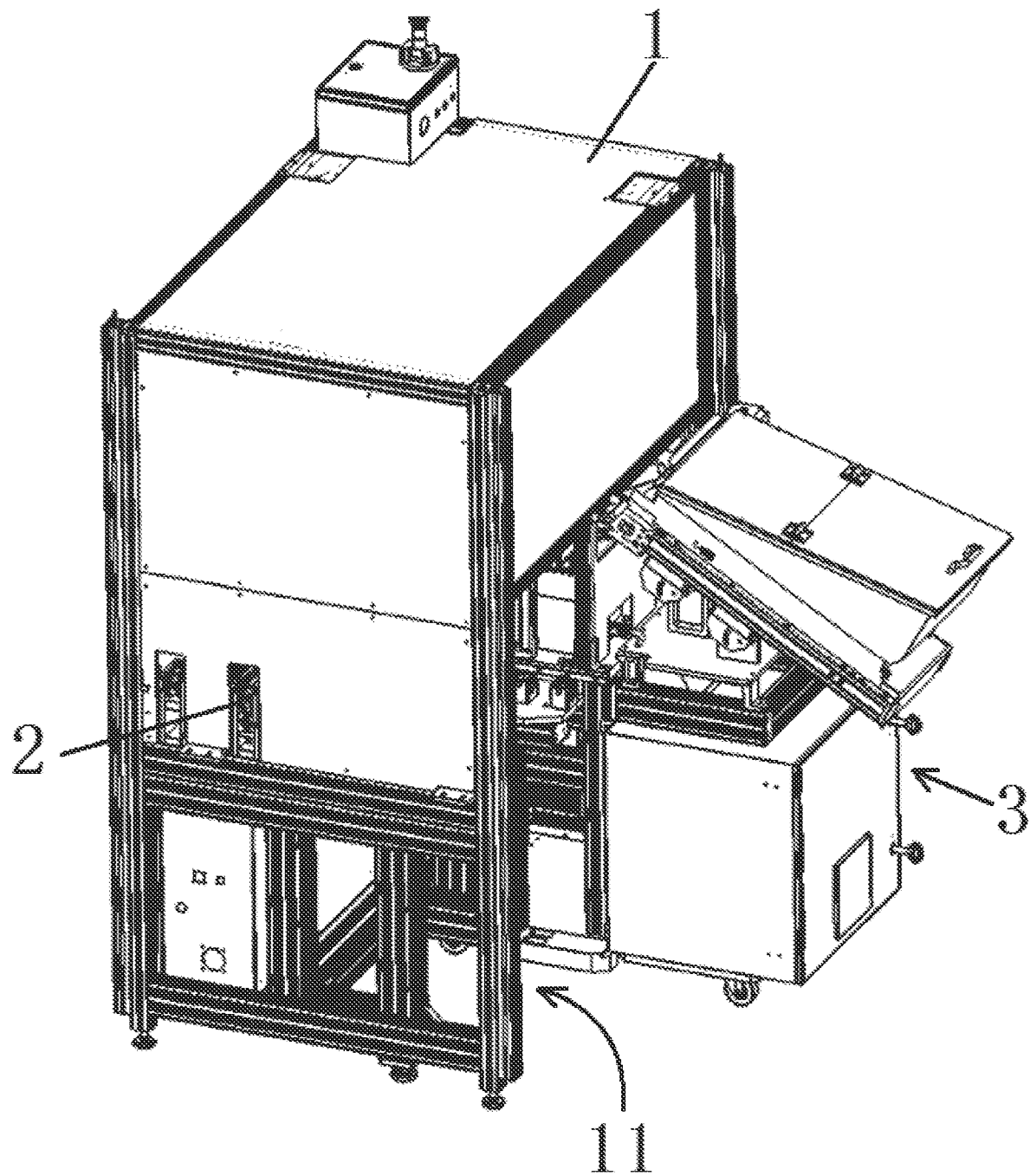
FIG. 3 shows an illustrative perspective view of a loading workstation according to an exemplary embodiment of the present invention when viewed from the front side.
Figure 4:
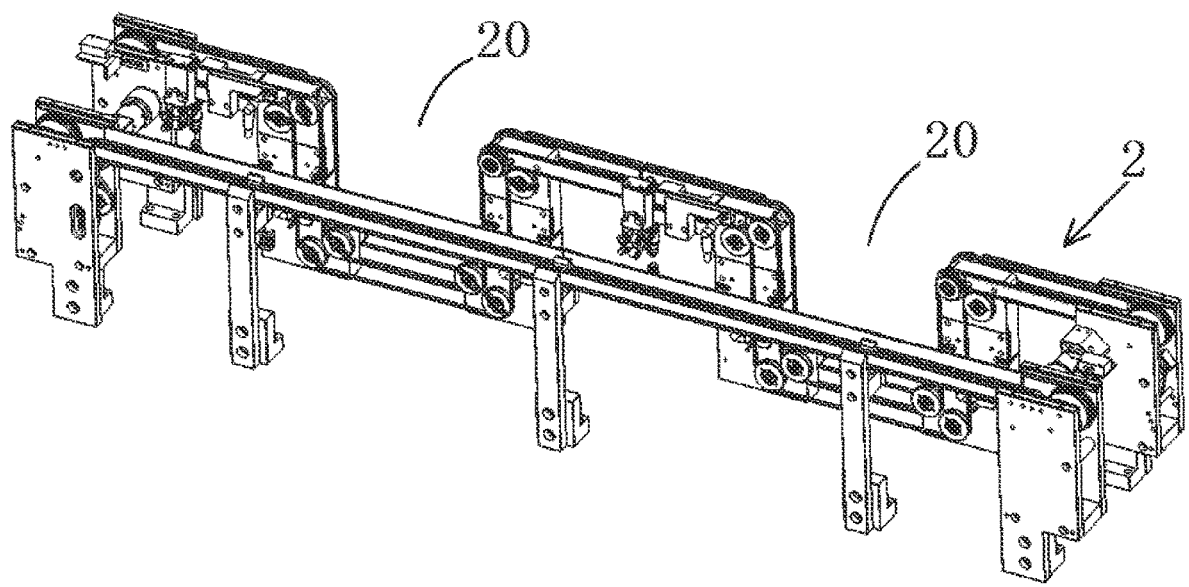
FIG. 4 shows an illustrative perspective view of a first transmission device of a loading workstation according to an exemplary embodiment of the present invention.
Figure 5:
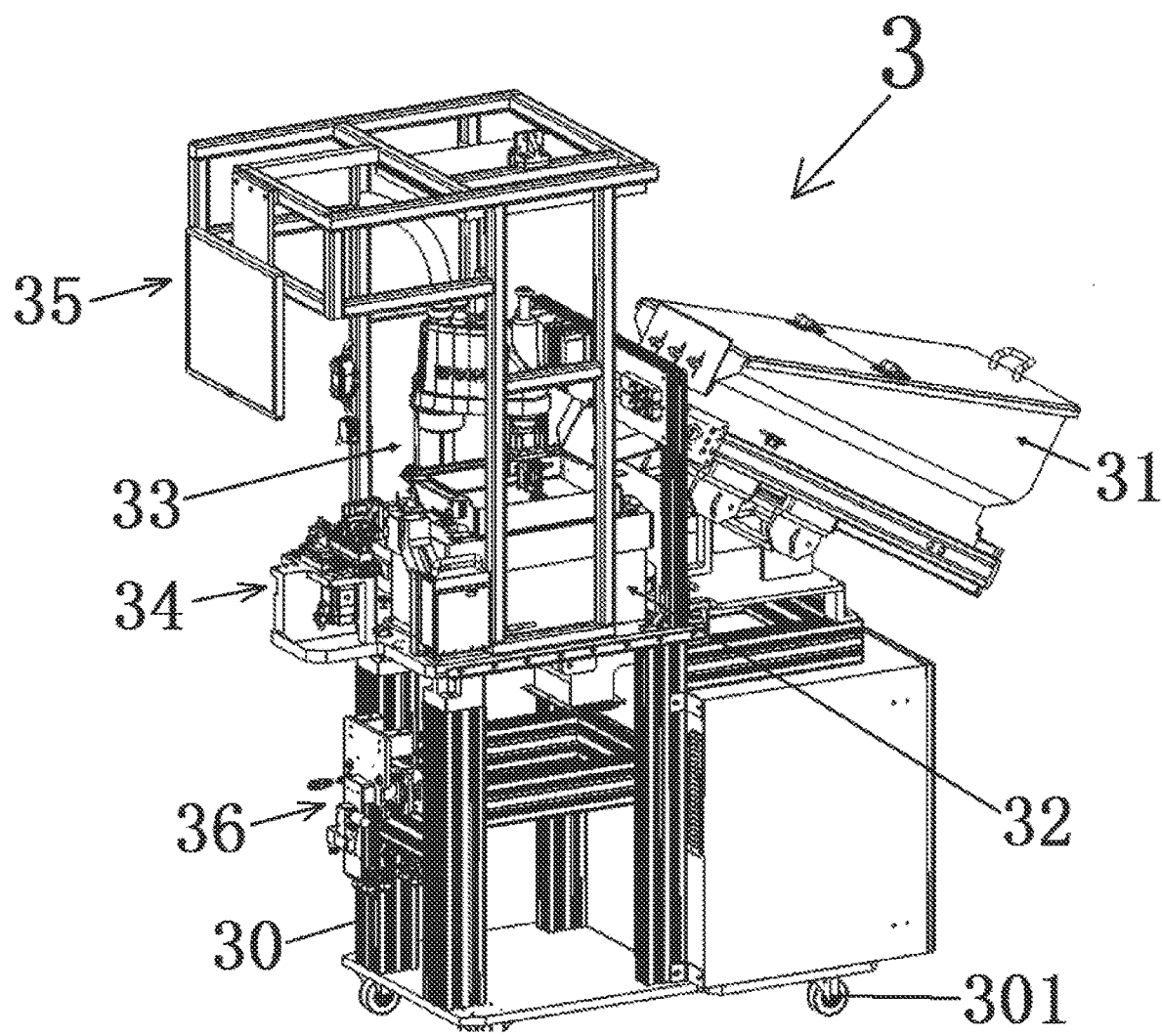
FIG. 5 shows an illustrative perspective view of a mobile vehicle of a loading workstation according to an exemplary embodiment of the present invention.

FIG. 1 shows an illustrative rear perspective view of the loading workstation according to an exemplary embodiment of the present invention. FIG. 2 shows a rear plan view of a loading workstation according to an exemplary embodiment of the present invention. FIG. 3 shows an illustrative front perspective view of a loading workstation according to an exemplary embodiment of the present invention. FIG. 4 shows an illustrative perspective view of the first transmission device 2 of a loading workstation according to an exemplary embodiment of the present invention. FIG. 5 shows an illustrative perspective view of the mobile vehicle 3 of a loading workstation according to an exemplary embodiment of the present invention.

As shown in FIGS. 1-5, in the illustrated embodiment, the loading workstation includes: a docking station 1 and a mobile vehicle 3. The docking station 1 includes a first transmission device 2. The first transmission device 2 is used to transmit a carrier 341 for loading components 100. The components 100 may be, for example, electronic components or other components.

Figure 6:
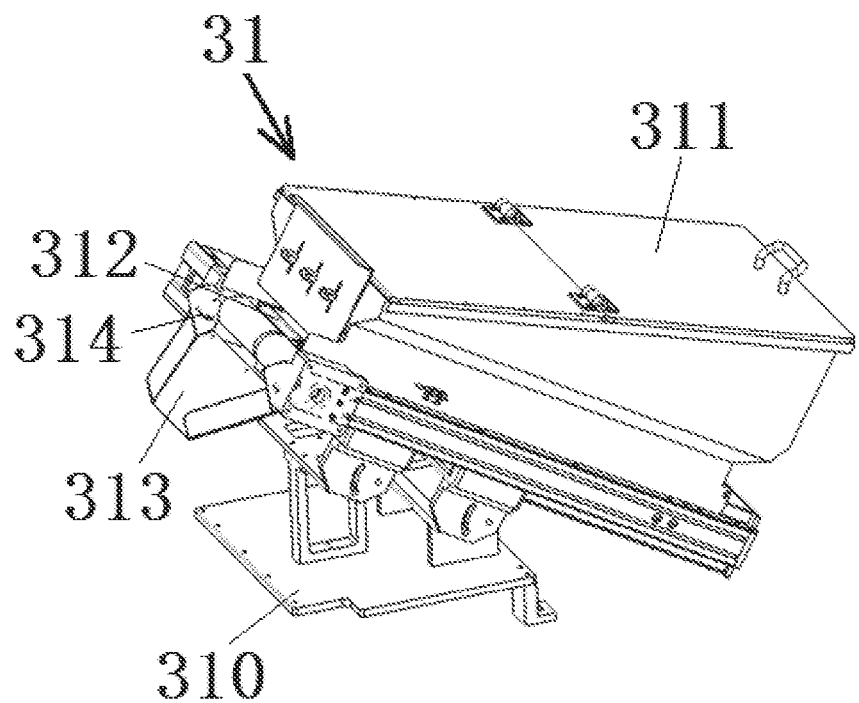
FIG. 6 shows an illustrative perspective view of a feeding device of a mobile vehicle according to an exemplary embodiment of the present invention.
Figure 8:
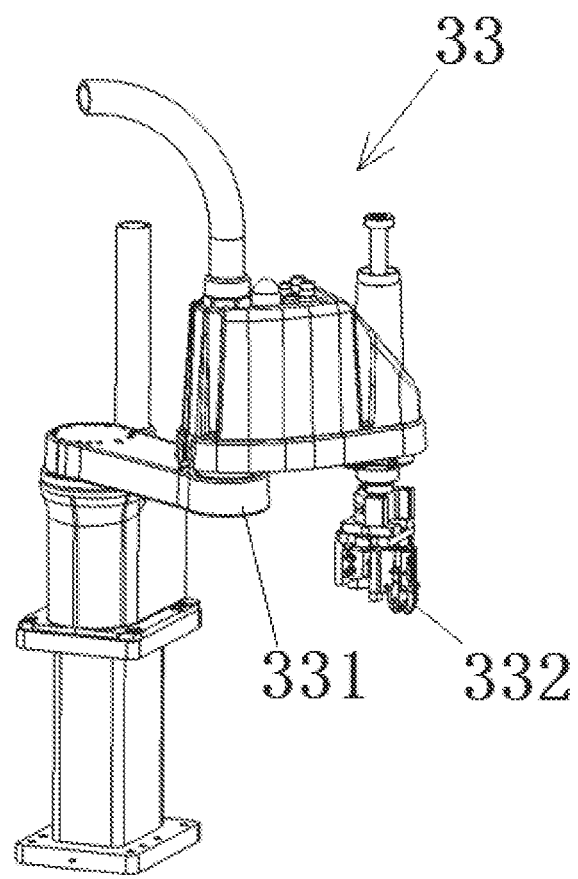
FIG. 8 shows an illustrative perspective view of a loading device of a mobile vehicle according to an exemplary embodiment of the present invention.
Figure 9:
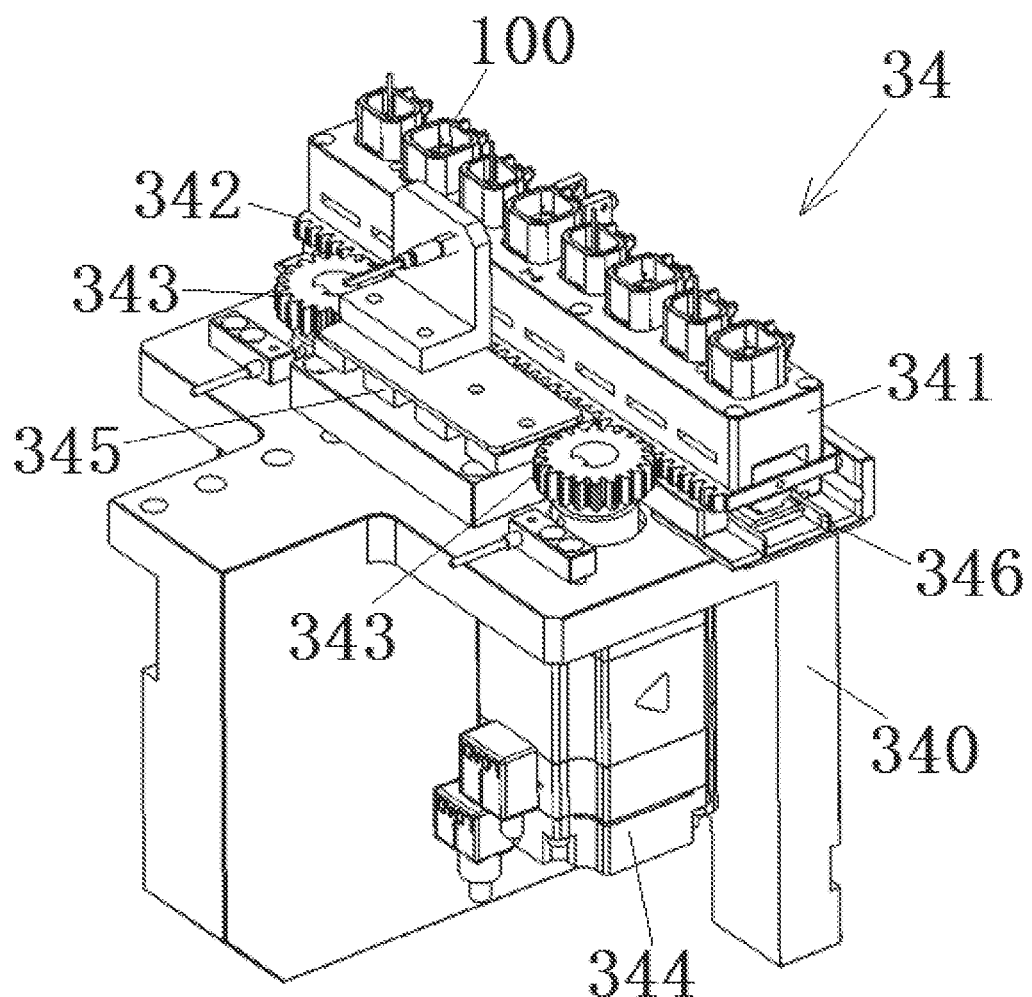
FIG. 9 shows an illustrative perspective view of a second transmission device of a mobile vehicle according to an exemplary embodiment of the present invention.

FIG. 6 shows an illustrative perspective view of a feeding device 31 of a mobile vehicle according to an exemplary embodiment of the present invention. FIG. 8 shows an illustrative perspective view of a loading device 33 of a mobile vehicle according to an exemplary embodiment of the present invention. FIG. 9 shows an illustrative perspective view of a second transmission device 34 of a mobile vehicle according to an exemplary embodiment of the present invention.

Referring generally to FIGS. 1-6, 8 and 9, the mobile vehicle 3 includes the second transmission device 34, the feeding device 31 and the loading device 33. The second transmission device 34 is adapted to dock with the first transmission device 2 to allow the carrier 341 to be continuously transmitted on the first transmission device 2 and the second transmission device 34. The feeding device 31 is used to supply the components 100 to be loaded. The loading device 33 is used to load the supplied components 100 onto the carrier 341 that has been transferred to the second transmission device 34.

The first transmission device 2 includes at least one interruption gap or void 20 in which the second transmission device 34 is docked and a connection between the first transmission device 2 and the second transmission device 34 is formed. In this way, the continuous transmission of the carrier 341 on the first transmission device 2 and the second transmission device 34 is ensured.

The docking station 1 further comprises a frame. The first transmission device 2 and the first interface device 10 are arranged in the frame. A docking chamber 11 for accommodating the mobile vehicle 3 is provided in the frame. When the mobile vehicle 3 moves into the docking chamber 11, the second transmission device 34 and the second interface device 36 on the mobile vehicle 3 are docked with the first transmission device 2 and the first interface device 10 on the docking station 1, respectively. The docking station 1 further comprises a locking device installed on the frame to lock the mobile vehicle 3 in the docking chamber 11 of the frame. The locking device prevents the mobile vehicle 3 from being moved during docking. After the locking device is unlocked, the mobile vehicle 3 can be separated from docking station 1.

Still referring to FIGS. 1-6, 8 and 9, the second transmission device 34 includes a slide rail 346, a rack 342 and a pair of gears 343. The slide rail 346 extends in the transmission direction of the carrier 341 and is suitable for sliding fit with the carrier 341 to guide the carrier 341 to move along the slide rail 346. The rack 342 extends in the transmission direction and is connected to or integrally formed on the carrier 341. The pair of gears 343 are spaced a predetermined distance in the transmission direction for engagement with the rack 342. When the gear 343 is engaged with the rack 342 on the carrier 341, the gear 343 can drive the carrier 341 to move along the transmission direction on the slide rail 346.

The second transmission device 34 further comprises a blocking device 345. The blocking device 345 is used to contact with the rack 342 to exert a frictional resistance on the rack 342 opposite to the transmission direction, so that the teeth clearance between the teeth of the rack 342 and the teeth of the gear 343 engaged with it is equal to zero. The blocking device 345 may include, for example, an elastic member in frictional contact with the rack 342 to exert a frictional resistance on the rack 342 in the opposite direction of transmission. The second transmission device 34 further comprises a driving device 344. The drive unit 344 is used to drive the pair of gears 343 to rotate.

The mobile vehicle 3 includes a vehicle body 30 and wheels 301 installed at the bottom of the vehicle body 30 to allow the mobile vehicle 3 to move freely. The second transmission device 34 further comprises a mounting frame 340, which is fixed to the carrier body 30. The slide rail 346, the rack 342, the gear 343, the driving device 344 and the blocking device 345 are mounted on the mounting frame 340.

Figure 11:
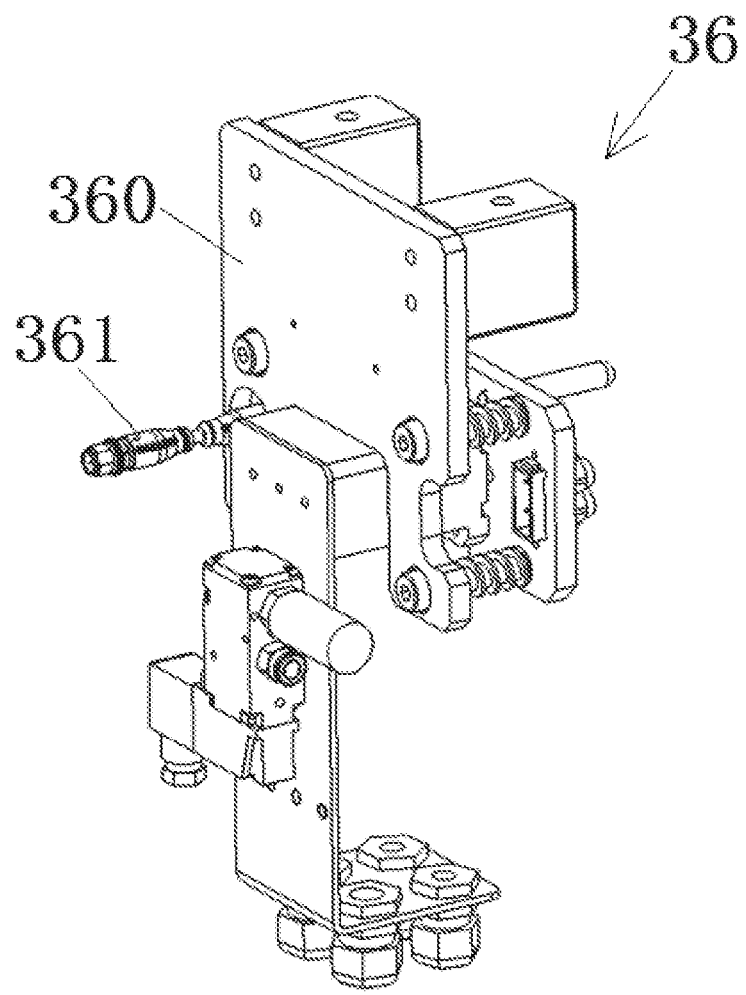
FIG. 11 shows an illustrative perspective view of a second interface device of a mobile vehicle according to an exemplary embodiment of the present invention.

FIG. 11 shows an illustrative perspective view of a second interface device 36 of a mobile vehicle according to an exemplary embodiment of the present invention. As shown in FIGS. 1-6 and 11, the docking station 1 further comprises a first interface device 10. The first interface device 10 includes a first interface. The mobile vehicle 3 further comprises a second interface device 36. The second interface device 36 includes a second interface 361 adapted to dock with the first interface. The first interface and the second interface 361 are hybrid interfaces capable of simultaneously realizing at least two of an electrical connection, a gas connection and a signal connection. In the illustrated embodiment, the second interface device 36 further comprises a mounting plate 360, the second interface 361 is mounted on the mounting plate 360, and the mounting plate 360 is fixed to the vehicle body 30 of the mobile vehicle 3.

Referring again to FIGS. 1-6, 8 and 9, the feeding device 31 includes a container 311, a conveyor 312, and a guide member 313. The container 311 is used to contain the components 100 to be supplied. The conveyor 312 is arranged in the container 311 and is used to convey the components 100 to the outlet of the container 311. The conveyor 312 may be, for example, a stick conveyor. The guide member 313 is communicated with the outlet of the container 311, and is used to guide the components 100 conveyed from the outlet of the container 311 into a vibration device 32.

The feeding device 31 may further include a blowing device 314 adapted to blow out the components 100 conveyed from the outlet of the containing container 311 to prevent the components 100 from blocking the outlet of the containing container 311. The gas of the blowing device 314 may be provided via the first interface device 10 and the second interface device 36. In the illustrated embodiment, the feeding device 31 may further comprise a mounting base plate 310. The container 311 can be installed on the mounting base plate 310, which is fixed to the vehicle body 30 of the mobile vehicle 3.

Figure 7:
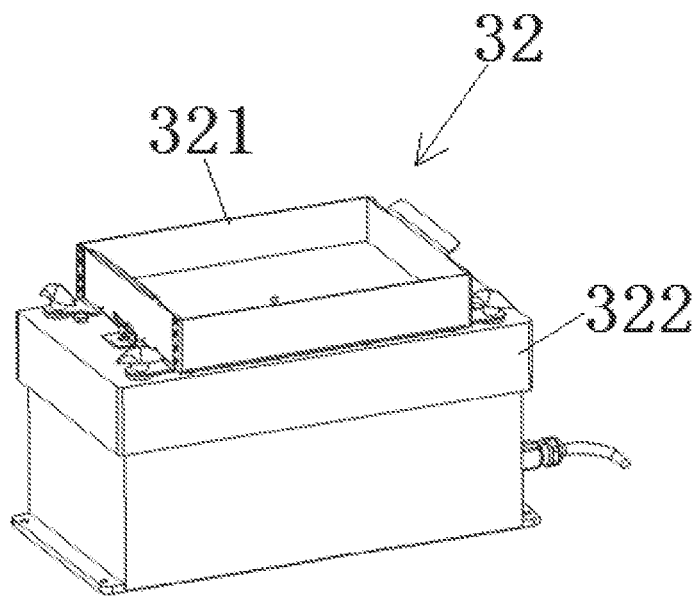
FIG. 7 shows an illustrative perspective view of a vibration device of a mobile vehicle according to an exemplary embodiment of the present invention.

FIG. 7 is an illustrative perspective view of the vibration device 32 of a mobile vehicle according to an exemplary embodiment of the present invention. As shown in FIGS. 1-9, in the illustrated embodiment, the mobile vehicle 3 further comprises a vibration device 32. The vibration device 32 is adapted to make or orient the supplied components 100 in a predetermined posture by vibration. In the illustrated embodiment, the vibration device 32 may include a vibration box 321 and a vibrator 322. The vibration box 321 is used to receive the components 100 delivered from the feeding device 31. The vibrator 322 is used to drive the vibration of the vibration box 321 so that the components 100 in the vibration box 321 are vibrated to the predetermined posture. The vibration box 321 is installed on the vibrator 322, and the base of the vibrator 322 is fixed on the vehicle body 30 of the mobile vehicle 3.

In the exemplary embodiment, the loading device 33 includes a robot 331 and a gripper 332. The robot 331 has a plurality of degrees of freedom of motion. The gripper 332 is mounted on the robot 331 and is suitable for grasping various components 100. The robot 331 is adapted to grasp the component 100 in the predetermined posture by the gripper 332 and load the captured component 100 on the carrier 341 in the predetermined posture.

Figure 10:
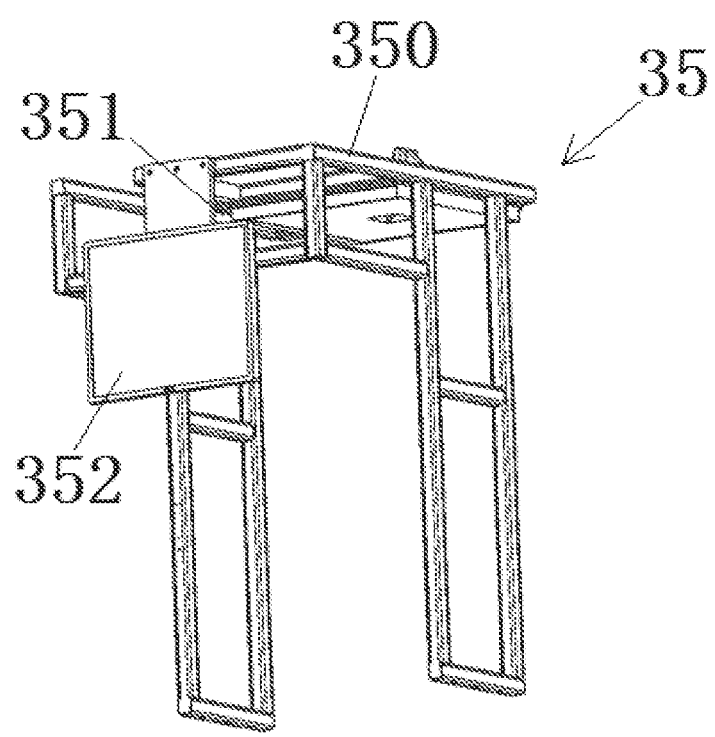
FIG. 10 shows an illustrative perspective view of a visual device of a mobile vehicle according to an exemplary embodiment of the present invention.

FIG. 10 is an illustrative perspective view of a visual device 35 of the mobile vehicle 3 according to an exemplary embodiment of the present invention. Referring to FIGS. 1-10, the visual device 35 is used to identify the component 100 in the predetermined posture and provide visual guidance for the loading device 33. The loading device 33 is adapted to pick up the component 100 in the predetermined posture and load the picked up the component 100 on the carrier 341 in the predetermined posture under the visual guidance of the visual device 35. In the illustrated embodiment, the visual device 35 includes a camera 351 and a display 352. The camera 351 is used to provide visual guidance for the loading device 33. The display 352 is used to display video images acquired by the camera 351 in real time. The visual device 35 may further comprise a support frame 350. The camera 351 and the display 352 are mounted on a support frame 350 which is fixed to the vehicle body 30 of the mobile vehicle 3.

As shown in FIGS. 1-11, the feeding device 31, the vibration device 32, the loading device 33, the second transmission device 34, the visual device 35 and the second interface device 36 are simultaneously integrated on the mobile vehicle 3. Therefore, the structure of the entire loading workstation is simplified, and the working efficiency of the loading workstation is improved.

In addition, those areas in which it is believed that those of ordinary skill in the art are familiar, have not been described herein in order not to unnecessarily obscure the invention described. Accordingly, it has to be understood that the invention is not to be limited by the specific illustrative embodiments, but only by the scope of the appended claims.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of the elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A loading workstation, comprising:
   a docking station including a first transmission device adapted to transmit a carrier for loading components; and
   a mobile vehicle, including:
      a second transmission device adapted to dock with the first transmission device to allow the carrier to be continuously transmitted on the first transmission device and the second transmission device;
      a feeding device adapted to supply components to be loaded; and
      a loading device adapted to load the supplied components onto the carrier that has been transferred to the second transmission device.

2. The loading workstation according to claim 1, wherein the docking station further comprises a first interface device including a first connection interface, and the mobile vehicle further comprises a second connection interface device including a second interface adapted to interface with the first interface.

3. The loading workstation according to claim 2, wherein the docking station further comprises a frame defining a docking chamber accommodating the mobile vehicle.

4. The loading workstation according to claim 3, wherein the first transmission device and the first interface device are provided in the frame, and, when the mobile vehicle moves into the docking chamber, the second transmission device and the second interface device are docked with a respective one of the first transmission device and the first interface device.

5. The loading workstation according to claim 2, wherein the first interface and the second interface are hybrid interfaces adapted to simultaneously realize at least two of an electrical connection, a gas connection or a signal connection.

6. The loading workstation according to claim 1, wherein the second transmission device further comprises a slide rail extending along a transmission direction of the carrier.

7. The loading workstation according to claim 6, wherein the second transmission device further comprises:
   a rack extending along the transmission direction and adapted to be connected to the carrier; and
   a pair of gears spaced a predetermined distance in the transmission direction for engaging with the rack for driving the carrier to move along the transmission direction on the slide rail.

8. The loading workstation according to claim 7, wherein the second transmission device further comprises a blocking device frictionally contacting the rack and applying a frictional resistance opposite to the transmission direction for eliminating a tooth clearance between teeth of the rack and teeth of the engaged gears.

9. The loading workstation according to claim 8, wherein the second transmission device further comprises a driving device for driving the pair of gears to rotate.

10. The loading workstation according to claim 9, wherein the second transmission device further comprises a mounting frame on which the slide rail, the rack, the pair of gears, the driving device and the blocking device are mounted.

11. The loading workstation according to claim 1, wherein the first transmission device defines an interruption gap sized to receive the second transmission device to be docked therewith.

12. The loading workstation according to claim 1, wherein the mobile vehicle further comprises a vibration device adapted to orient the supplied components in a predetermined posture.

13. The loading workstation according to claim 12, wherein the mobile vehicle further comprises a visual device for identifying the components in the predetermined posture and providing visual guidance to the loading device, the loading device is adapted to pick up the components in the predetermined posture under the visual guidance of the visual device and load the picked components on the carrier in the predetermined posture.

14. The loading workstation according to claim 13, wherein the visual device includes:
   a camera providing visual guidance for the loading device; and
   a display displaying video images acquired by the camera in real time.

15. The loading workstation according to claim 13, wherein the mobile vehicle comprises a vehicle body and wheels installed at a bottom of the vehicle body.

16. The loading workstation according to claim 12, wherein the feeding device comprises:
   a container for containing the components to be supplied;
   a conveyor arranged in the container for conveying the components to an outlet of the container; and
   a guide member communicated with the outlet of the container for guiding the components from the outlet of the container into the vibration device.

17. The loading workstation according to claim 12, wherein the vibration device includes a vibrating box for receiving the components conveyed from the feeding device and a vibrator driving the vibration box to vibrate.

18. The loading workstation according to claim 12, wherein the loading device includes:
   a robot having multiple degrees of freedom of motion; and
   a gripper mounted on the robot, the robot is adapted to grip the component in the predetermined posture by the gripper and load the gripped component on the carrier in the predetermined posture.

19. A loading workstation, comprising:
   a docking station including a first transmission device adapted to transmit a carrier for loading components; and
   a mobile vehicle, including:
      a slide rail adapted to dock with the first transmission device to allow the carrier to be continuously transmitted on the first transmission device and on the slide rail;
      a conveyor adapted to supply components to be loaded; and
      a gripper adapted to load the supplied components onto the carrier that has been transferred to the slide rail.

* * * * *